(12) United States Patent
Ikeuchi et al.

(10) Patent No.: US 6,285,258 B1
(45) Date of Patent: Sep. 4, 2001

(54) OFFSET VOLTAGE TRIMMING CIRCUIT

(75) Inventors: Akira Ikeuchi, Atsugi; Kyozo Makime, Isehara, both of (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/364,009

(22) Filed: Jul. 29, 1999

(30) Foreign Application Priority Data

Aug. 27, 1998 (JP) .................................................. 10-241937

(51) Int. Cl.[7] ......................................................... H03F 3/04
(52) U.S. Cl. ............................................. 330/288; 330/256
(58) Field of Search .................................. 330/256, 257, 330/288, 289; 327/307

(56) References Cited

U.S. PATENT DOCUMENTS

| | | | |
|---|---|---|---|
| 4,038,607 | * | 7/1977 | Schade, Jr. ............................ 330/288 |
| 4,454,416 | * | 6/1984 | Gontowski, Jr. et al. ............ 330/288 |
| 4,485,313 | * | 11/1984 | Nagano .................................. 327/530 |
| 4,611,178 | * | 9/1986 | Naylor et al. ......................... 330/272 |
| 4,612,496 | * | 9/1986 | Hines .................................... 330/288 |
| 6,049,253 | * | 4/2000 | Takayama ............................. 330/255 |
| 6,097,254 | * | 8/2000 | Yamamoto ............................ 330/298 |

* cited by examiner

Primary Examiner—Benny Lee
Assistant Examiner—Khanh Van Nguyen
(74) Attorney, Agent, or Firm—Ladas & Parry

(57) ABSTRACT

An offset voltage trimming circuit for sending a current from a constant-current source to a trimming resistor and thus obtaining an offset voltage, the offset voltage trimming circuit having a Zener diode with a temperature characteristic of zero, a transistor connected so as to form a diode and connected in series to the Zener diode, a current-mirror circuit connected to the transistor and a second resistor connected in series to the current-mirror circuit and having a temperature characteristic identical to that of the trimming resistor, with the current being supplied to the trimming resistor from the current-mirror circuit in order to prevent changes in the offset voltage due to changes in temperature.

5 Claims, 3 Drawing Sheets

OFFSET VOLTAGE TRIMMING CIRCUIT

BACKGROUND OF THE INVENTION

1. Field of the Invention

The present invention relates generally to an offset voltage trimming circuit, and more particularly, to an offset voltage trimming circuit for adjusting the offset voltage of a sense amplifier circuit for amplifying and outputting a differential voltage of an input voltage.

2. Description of the Related Art

Conventionally, a sense amplifier circuit offset voltage trimming circuit like that shown in FIG. 2 is known. In FIG. 2, input signals applied to a pair of input terminals 10, 11 are supplied to the bases of npn transistors Q1, Q2 which together comprise the differential circuit (sense amplifier circuit). The emitters of transistors Q1, Q2 are jointly connected and grounded via a constant-current source 12.

The respective collectors of the transistors Q1, Q2 are connected to both ends of a resistor R3 that determines the gain and at the same time are connected to one end of each of trimming resistors R1, R2 that adjust the offset voltage. The remaining ends of trimming resistors R1, R2 are connected to a pair of output terminals 13, 14, respectively, and, at the same time, are connected to power supplies Vcc via constant-current sources 15, 16.

By connecting in series diffused resistors Ra1 through Ran which have been shorted across both ends with aluminum wiring 17 and then using a laser to remove the points on the aluminum wiring marked with an "X" as shown in FIG. 3, the trimming resistors R1, R2 shown in FIG. 2 can adjust the resistance value. By adjusting this resistance value, the offset voltage for the transistors Q1, Q2 is adjusted so that the output voltage between the pair of output terminals 13, 14 becomes zero when the voltage between the pair of input terminals 10, 11 is zero.

Conventionally, the circuit shown in FIG. 4 has been used as constant-current sources 15, 16. In FIG. 4 the base of npn transistor Q11 is grounded via resistor R11, the emitter is grounded and the collector is connected to the power supply Vcc via resistor R12. Additionally, the emitter of npn transistor Q12 is connected to the base of transistor Q11 and the base of npn transistor Q12 is connected to the collector of transistor Q11, with the collector of npn transistor Q12 acting as the current output terminal 20.

If the voltage at both ends of resistor R11 is $V_A$ (with $V_A$ being equivalent to a forward voltage drop $V_{BE}$ between the base and the transmitter of transistor Q11), then the output current $I_o$ at the current output terminal described above can be described as follows:

$$I_o = V_A / R11 \quad (1)$$

It should be noted that trimming resistors R1, R2 have positive temperature characteristics. That is, when the temperature rises the resistance increases. By contrast, in the constant-current source circuit shown in FIG. 4 the temperature characteristics of the output current $I_o$ is expressed in the following formula:

$$I_o/dT = (dV_A/dT - I_o dR11/dT)/R11 \approx \quad (2)$$
$$dV_A/dT(1/R11) \approx -2/R11 [mV/° C.]$$

T represents temperature, d represents the amount of increase, $dV_A/dT \gg I_o\, dR11/dT$ and $dV_A/dT$ is equivalent to the forward voltage drop $V_{BE}$ between the base and emitter of transistor Q11, so the output current $I_o$ has a temperature characteristic of approximately $-2[mV/° C.]$.

It should be noted that, in contrast to the trimming resistors R1, R2 which have positive temperature characteristics, the constant-current sources 15, 16 have negative temperature characteristics that cancel out the positive temperature characteristics of the trimming resistors.

However, it is difficult to make the two temperature characteristic absolute values equivalent and, as a result, a problem arises in that the offset voltage for transistors Q1, Q2 changes as the temperature changes.

SUMMARY OF THE INVENTION

Accordingly, it is the object of the present invention to provide an offset voltage trimming circuit in which the problem described above is solved. Specifically, it is the object of the invention to provide an offset voltage trimming circuit that prevents the offset voltage for the transistors Q1, Q2 from changing as the temperature changes.

The above-described object of the present invention is achieved by an offset voltage trimming circuit for sending a current from a constant-current source to a trimming resistor and thus obtaining an offset voltage, the offset voltage trimming circuit comprising:

a Zener diode with a temperature characteristic of zero;

a transistor connected so as to form a diode and connected in series to the Zener diode;

a current-mirror circuit connected to the transistor; and a second resistor connected in series to the current-mirror circuit and having a temperature characteristic identical to that of the trimming resistor, the current being supplied to the trimming resistor from the current-mirror circuit.

The above-described object of the present invention is also achieved by an offset voltage trimming circuit comprising:

a differential amplifier circuit outputting an offset voltage;

a trimming resistor connected to the differential amplifier circuit; and a pair of constant-current sources connected to the differential amplifier circuit, each of the pair of constant-current sources comprising:

a Zener diode with a temperature characteristic of zero;

a transistor connected so as to form a diode and connected in series to the Zener diode;

a current-mirror circuit connected to the transistor; and a second resistor connected in series to the current-mirror circuit and having a temperature characteristic identical to that of the trimming resistor, the current being supplied to the trimming resistor from the current-mirror circuit.

According to the invention described above, the temperature characteristics of the resistor and the trimming resistor cancel each other out and changes in voltage caused by changes in temperature can be prevented.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
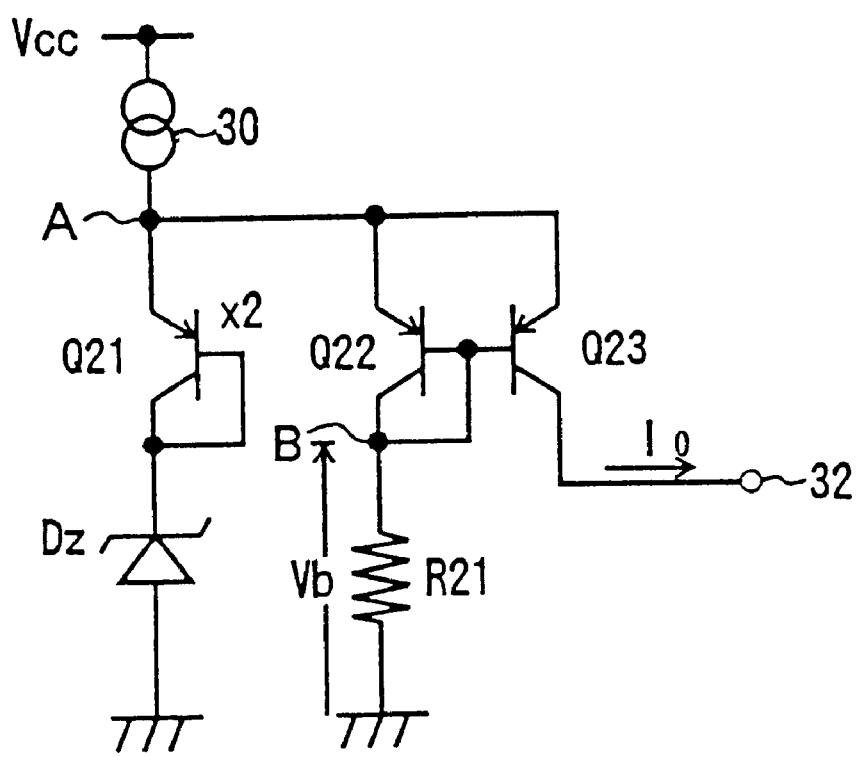
FIG. 1 is a circuit diagram of an embodiment of a constant-current source circuit adapted for use with the offset voltage trimming circuit of the present invention.
Figure 2:
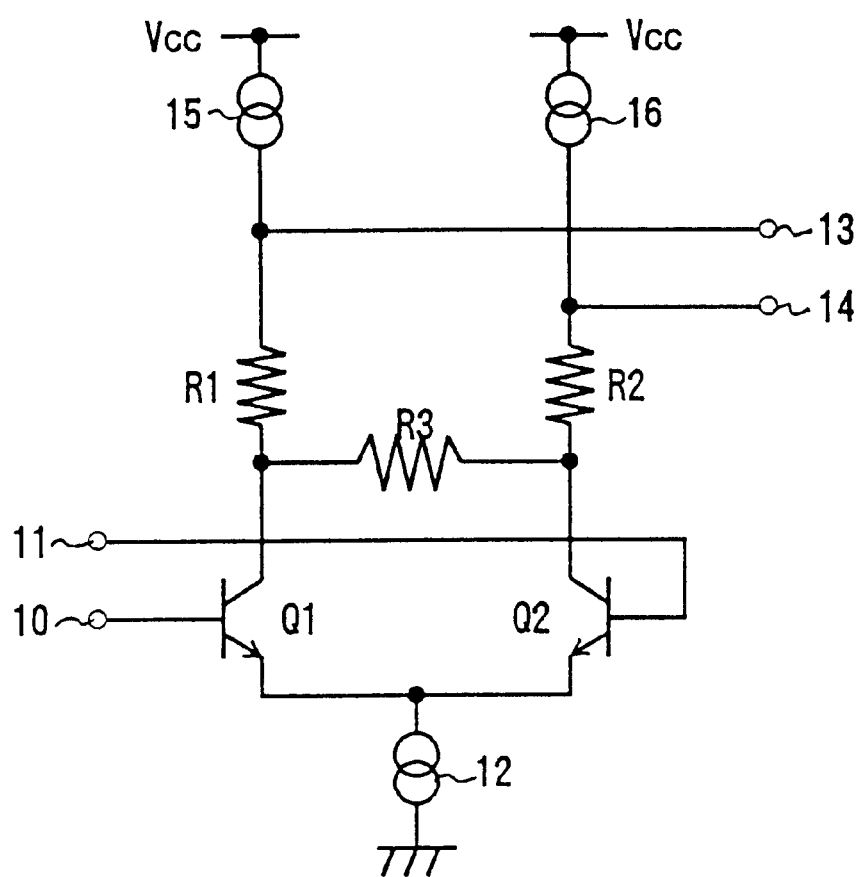
FIG. 2 is a structural diagram of an embodiment of an offset voltage trimming circuit of a sense amplifier circuit.
Figure 3:
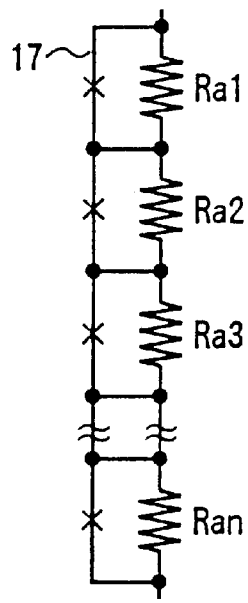
FIG. 3 is a diagram for describing trimming resistors R1, R2.
Figure 4:
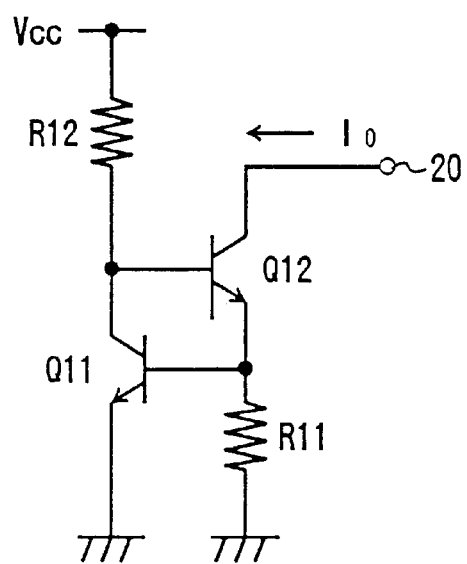
FIG. 4 is a circuit diagram of an embodiment of a constant-current source circuit adapted to a conventional offset voltage trimming circuit.

FIG. 1 is a circuit diagram of an embodiment of a constant-current source circuit adapted for use with the offset voltage trimming circuit of the present invention. This constant-current source circuit is used as the constant-current sources 15, 16 shown in FIG. 2. In FIG. 1, the pnp transistor Q21 is shorted across the base and the collector so as to form a diode, and this collector is connected to the cathode terminal of the Zener diode Dz. The anode terminal of the Zener diode Dz is grounded. This Zener diode DZ is set so that its temperature characteristic is virtually zero.

The emitter of transistor Q21 is connected to power supply Vcc via the constant-current source 30. Additionally, the emitter of transistor Q21 is jointly connected to the emitters of transistors Q21 and Q22, respectively. However, transistor Q21 has an emitter area that is twice that of either Q22 or Q23.

The bases of transistors Q22 and Q23 are jointly connected, with transistor Q22 shorted between the base and the collector so as to form a current-mirror circuit. The collector of transistor Q22 is connected to one end of resistor R21 and the remaining end of resistor R21 is grounded. The collector of transistor Q23 is connected to current output terminal 32. Resistor R21 is a diffused resistor similar to the trimming resistors R1, R2, and may, for example, be formed by the same diffusion process. As a result, resistor R21 has the same temperature characteristics as trimming resistors R1, R2. The current output terminal 32 is connected to the trimming resistors R1, R2 shown in FIG. 2.

Electric current flows from the power supply Vcc through the transistor Q21 and the Zener diode Dz via the constant-current source 30. Additionally, an identical amount of current flows to the respective emitters of transistor Q22 and transistor Q23 which together form the current-mirror circuit. The current $I_o$ that is output from the current output terminal 32 is expressed in terms of the following formula:

$$I_o = Vb/R21 \qquad (3)$$

Where Vb is the voltage across both ends of resistor R21.

At this time, the voltage at a point A, which is the collector of transistor Q21 is equal to the sum of the forward voltage drop $V_{BE}$ between the base and emitter of transistor Q21 added to the Zener voltage of the Zener diode Dz, and additionally, the temperature characteristic of the Zener diode Dz is zero, so the output current $I_o$ as a temperature characteristic of approximately $-2[mV/° C.]$.

Additionally, the voltage at a point B, which is the collector of transistor Q22, is equal to the difference of the voltage of point A minus the forward voltage drop $V_{BE}$ across the base and emitter of transistor Q22, with the temperature characteristic being zero. That is, the voltage Vb at point B is not affected by changes in temperature. As a result, the current $I_o$ described in terms of formula (3) above, which is output from the current output terminal 32 as affected by the resistor R21 having a temperature characteristic, flows through the trimming resistors R1, R2, and the voltage drop created thereby has a temperature characteristic of zero. The effect is that the temperature characteristics of the resistor and the trimming resistor cancel each other out.

The above description is provided in order to enable any person skilled in the art to make and use the invention and sets forth the best mode contemplated by the inventors of carrying out their invention.

The present invention is not limited to the specifically disclosed embodiments and variations, and modifications may be made without departing from the scope of the present invention.

The present application is based on Japanese Priority Application No. 10-241937 filed on Aug. 27, 1998, the entire contents of which are hereby incorporated by reference.

What is claimed is:

1. An offset voltage trimming circuit for sending a current from a constant-current source to a first resistor and thus obtaining an offset voltage, said offset voltage trimming circuit comprising:

a Zener diode with a temperature characteristic of zero;

a transistor connected so as to form a diode and connected in series to the Zener diode;

a current-mirror circuit connected to the transistor; and a second resistor connected in series to the current-mirror circuit and having a temperature characteristic identical to that of the first resistor, the current being supplied to the first resistor from the current-mirror circuit.

2. An offset voltage trimming circuit comprising:

a differential amplifier circuit outputting an offset voltage;

a first resistor connected to the differential amplifier circuit; and a pair of constant-current sources connected to the differential amplifier circuit, each of the pair of constant-current sources comprising:

a Zener diode with a temperature characteristic of zero;

a transistor connected so as to form a diode and connected in series to the Zener diode;

a current-mirror circuit connected to the transistor; and a second resistor connected in series to the current-mirror circuit and having a temperature characteristic identical to that of the first resistor, the current being supplied to the first resistor from the current-mirror circuit.

3. A constant-current source comprising:

a Zener diode with a temperature characteristic of zero;

a transistor connected so as to form a diode and connected in series to the Zener diode;

a current-mirror circuit connected to the transistor; and a resistor connected in series to the current-mirror circuit and having a temperature characteristic identical to that of another resistor provided in a circuit to which a current is supplied from the current-mirror circuit.

4. The constant-current source as claimed in claim 3, wherein the current-mirror circuit comprises a first current output terminal to which the resistor is connected, and a second current output terminal via which the current is supplied to the circuit.

5. The constant-current source as claimed in claim 3, comprising further a constant-current source circuit connected in series to the transistor.

* * * * *